(12) United States Patent
Park et al.

(10) Patent No.: US 10,748,833 B2
(45) Date of Patent: Aug. 18, 2020

(54) FAN-OUT SEMICONDUCTOR PACKAGE

(71) Applicant: SAMSUNG ELECTRONICS CO., LTD., Suwon-si (KR)

(72) Inventors: Seong Chan Park, Suwon-si (KR); Sang Hyun Kwon, Suwon-si (KR); Han Kim, Suwon-si (KR); Hye Lee Kim, Suwon-si (KR); Seung On Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/282,642

(22) Filed: Feb. 22, 2019

(65) Prior Publication Data

US 2020/0083137 A1 Mar. 12, 2020

(30) Foreign Application Priority Data

Sep. 6, 2018 (KR) .................. 10-2018-0106635

(51) Int. Cl.
*H01L 23/373* (2006.01)
*H01L 23/00* (2006.01)
(Continued)

(52) U.S. Cl.
CPC ...... *H01L 23/3732* (2013.01); *H01L 23/3107* (2013.01); *H01L 23/367* (2013.01);
(Continued)

(58) Field of Classification Search
CPC . H01L 23/3732; H01L 23/5226; H01L 24/32; H01L 23/3107; H01L 24/09;
(Continued)

(56) References Cited

U.S. PATENT DOCUMENTS 8,686,556 B2 4/2014 Clark et al.
2002/0058743 A1 5/2002 Tobita et al.
(Continued)

FOREIGN PATENT DOCUMENTS

EP 1186689 A1 3/2002
JP 09-312362 A 2/1997
(Continued)

OTHER PUBLICATIONS

Communication dated Dec. 10, 2019, issued by the Taiwan Patent Office in counterpart Taiwan Application No. 108106173.
(Continued)

*Primary Examiner* — Fernando L Toledo
*Assistant Examiner* — Adam S Bowen
(74) *Attorney, Agent, or Firm* — Sughrue Mion, PLLC

(57) ABSTRACT

A fan-out semiconductor package includes a semiconductor chip having an active surface on which connection pads are disposed and an inactive surface opposing the active surface, a heat dissipation member attached to the inactive surface of the semiconductor chip and having a thickness greater than a thickness of the semiconductor chip, an encapsulant encapsulating at least a portion of each of the semiconductor chip and the heat dissipation member, and a connection member disposed on the active surface of the semiconductor chip and including redistribution layers electrically connected to the connection pads, wherein the heat dissipation member is a complex of carbon and a metal.

17 Claims, 13 Drawing Sheets

(51) Int. Cl.
    *H01L 23/522*     (2006.01)
    *H01L 23/367*     (2006.01)
    *H01L 23/31*     (2006.01)

(52) U.S. Cl.
    CPC .......... *H01L 23/5226* (2013.01); *H01L 24/09* (2013.01); *H01L 24/32* (2013.01); *H01L 2224/02377* (2013.01); *H01L 2224/02379* (2013.01)

(58) Field of Classification Search
    CPC ......... H01L 23/367; H01L 2224/02379; H01L 2224/02377
    USPC ........................................................ 257/712
    See application file for complete search history.

(56) References Cited

U.S. PATENT DOCUMENTS

| | | |
|---|---|---|
| 2005/0189647 A1 | 9/2005 | Sung |
| 2012/0164429 A1 | 6/2012 | Shah et al. |
| 2012/0241943 A1 | 9/2012 | Sung |
| 2015/0348865 A1* | 12/2015 | Vincent .................. H01L 24/03 257/712 |
| 2017/0069562 A1* | 3/2017 | Ide ....................... H01L 23/528 |
| 2017/0287805 A1 | 10/2017 | Ozawa et al. |
| 2017/0309571 A1 | 10/2017 | Yi et al. |
| 2018/0063961 A1 | 3/2018 | Kim et al. |

FOREIGN PATENT DOCUMENTS

| | | |
|---|---|---|
| JP | 2005-005528 A | 6/2005 |
| JP | 2006-045596 A | 2/2006 |
| JP | 2010-073851 A | 4/2010 |
| JP | 2013-254880 A | 12/2013 |
| JP | 2017-183521 A | 10/2017 |
| KR | 10-2012-0117998 A | 10/2012 |
| KR | 10-1411953 B1 | 7/2014 |
| KR | 10-2018-0023384 A | 3/2018 |
| TW | I259211 B | 8/2006 |
| TW | 200633169 A | 9/2006 |
| TW | 201220445 A1 | 5/2012 |
| TW | 201334130 A1 | 8/2013 |

OTHER PUBLICATIONS

Communication dated Jan. 27, 2020, issued by the Korean Intellectual Property Office in corresponding Korean Application No. 10-2018-0106635.

Communication dated Mar. 24, 2020 from the Taiwanese Patent Office in application No. 108106173.

* cited by examiner

FAN-OUT SEMICONDUCTOR PACKAGE

CROSS-REFERENCE TO RELATED APPLICATION(S)

This application claims benefit of priority to Korean Patent Application No. 10-2018-0106635 filed on Sep. 6, 2018 in the Korean Intellectual Property Office, the disclosure of which is incorporated herein by reference in its entirety.

TECHNICAL FIELD

The present disclosure relates to a fan-out semiconductor package in which electrical connection structures may be expanded outwardly of a region in which a semiconductor chip is disposed.

BACKGROUND

One of recent major trends in development of semiconductor chip technology is to reduce a size of a component. As a result, a semiconductor package is required to have a compact size, and, at the same time, implement a plurality of pins in accordance with a rapid increase in demand for a compact semiconductor chip, and the like, even in the field of package technology.

One type of semiconductor package technology suggested to satisfy the technical demand described above, is a fan-out package. Such a fan-out package may have a compact size and allow a plurality of pins to be implemented by redistributing electrical connection structures outwardly of a region in which a semiconductor chip is disposed.

Meanwhile, recently, the fan-out package has been required to improve a heat dissipation function which is necessary in a premium application processor (AP).

SUMMARY

An aspect of the present disclosure may provide a fan-out semiconductor package having an excellent heat dissipation characteristic and including a heat dissipation member having a thermal expansion property similar to that of a semiconductor chip.

According to an aspect of the present disclosure, a fan-out semiconductor package may include: a semiconductor chip having an active surface on which connection pads are disposed and an inactive surface opposing the active surface; a heat dissipation member attached to the inactive surface of the semiconductor chip and having a thickness greater than a thickness of the semiconductor chip; an encapsulant encapsulating at least a portion of each of the semiconductor chip and the heat dissipation member; and a connection member disposed on the active surface of the semiconductor chip and including redistribution layers electrically connected to the connection pads, wherein the heat dissipation member is a complex of carbon and a metal.

The heat dissipation member may have a form in which carbon particles are dispersed in a metal matrix.

The carbon particles may have shape-anisotropy and have a form in which a major axis of each of the carbon particles is oriented substantially in a thickness direction of the semiconductor chip.

A metal layer may be coated on a surface of each of the carbon particles.

The heat dissipation member may have a structure in which a plurality of heat dissipation layers are stacked.

The carbon particles may have shape-anisotropy and orientations of carbon particles included in the plurality of heat dissipation layers may be different from each other.

The heat dissipation member may further include an additive, and the additive may include at least one of zirconium (Zr), chromium (Cr), and boron (B).

A content of the additive in the heat dissipation member may be less than about 5 wt % with respect to the heat dissipation member.

The heat dissipation member may be attached to the inactive surface of the semiconductor chip through an adhesive layer.

The adhesive layer may include a heat dissipation filler.

A thickness of the adhesive layer may be 1 μm or less.

The heat dissipation member may be directly bonded to the inactive surface of the semiconductor chip.

The fan-out semiconductor package may further include a metal pattern layer disposed on the other surface of the heat dissipation member opposing one surface of the heat dissipation member on which the semiconductor chip is disposed and having an unevenness surface structure.

The fan-out semiconductor package may further include: a heat dissipation pattern layer disposed on the encapsulant; and heat dissipation vias penetrating at least portions of the encapsulant and connecting the heat dissipation pattern layer and the heat dissipation member to each other.

The carbon included in the heat dissipation member may include one or more selected from the group consisting of diamond, diamond-like carbon, graphite, and graphene.

A content of the carbon in the heat dissipation member may be about 20 wt % to 80 wt % with respect to the heat dissipation member.

The metal included in the heat dissipation member may include one or more selected from the group consisting of copper (Cu), aluminum (Al), and silver (Ag).

A content of the metal in the heat dissipation member may be about 20 wt % to 80 wt % with respect to the heat dissipation member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

Electronic Device

Figure 1:
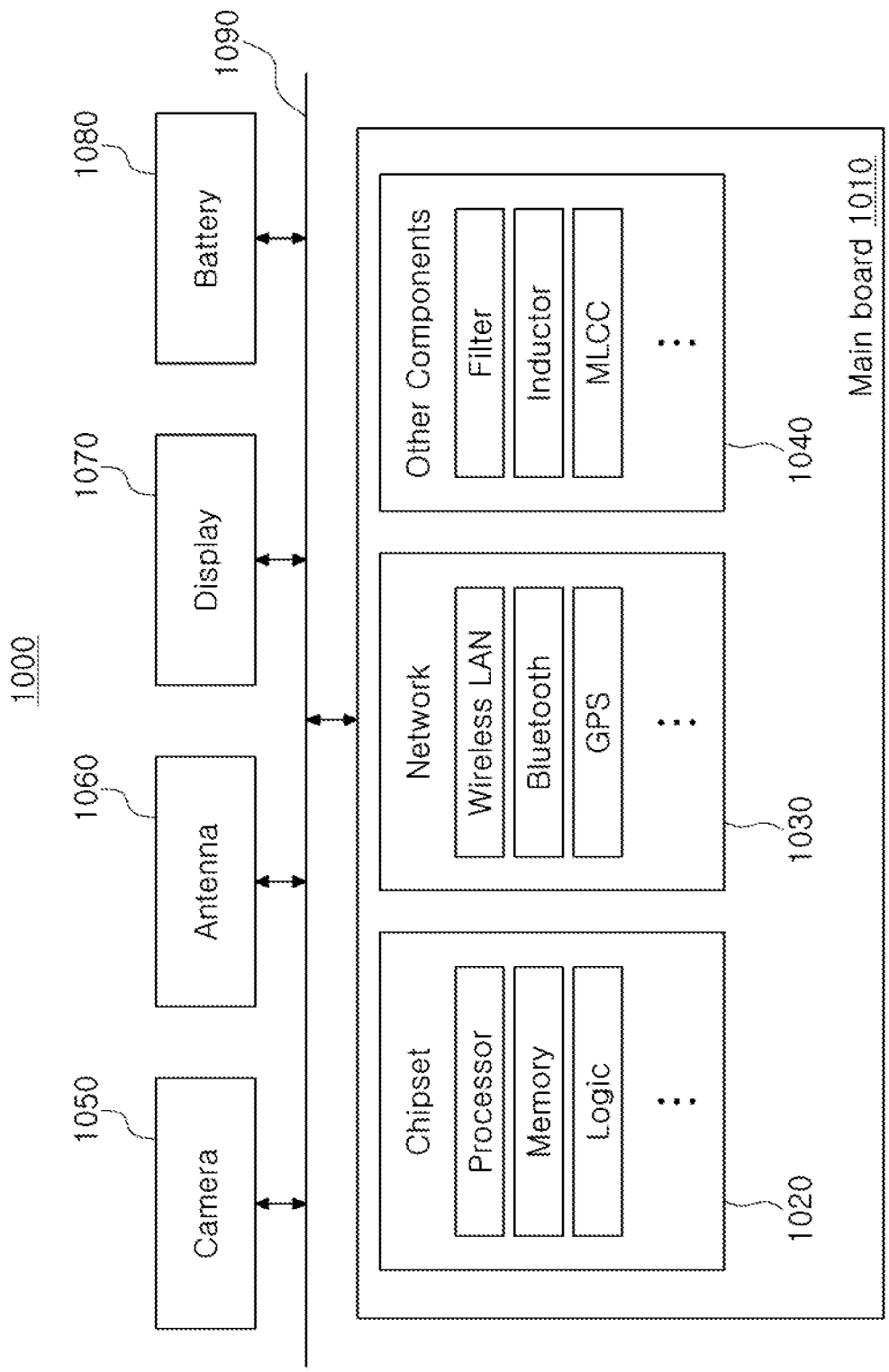
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
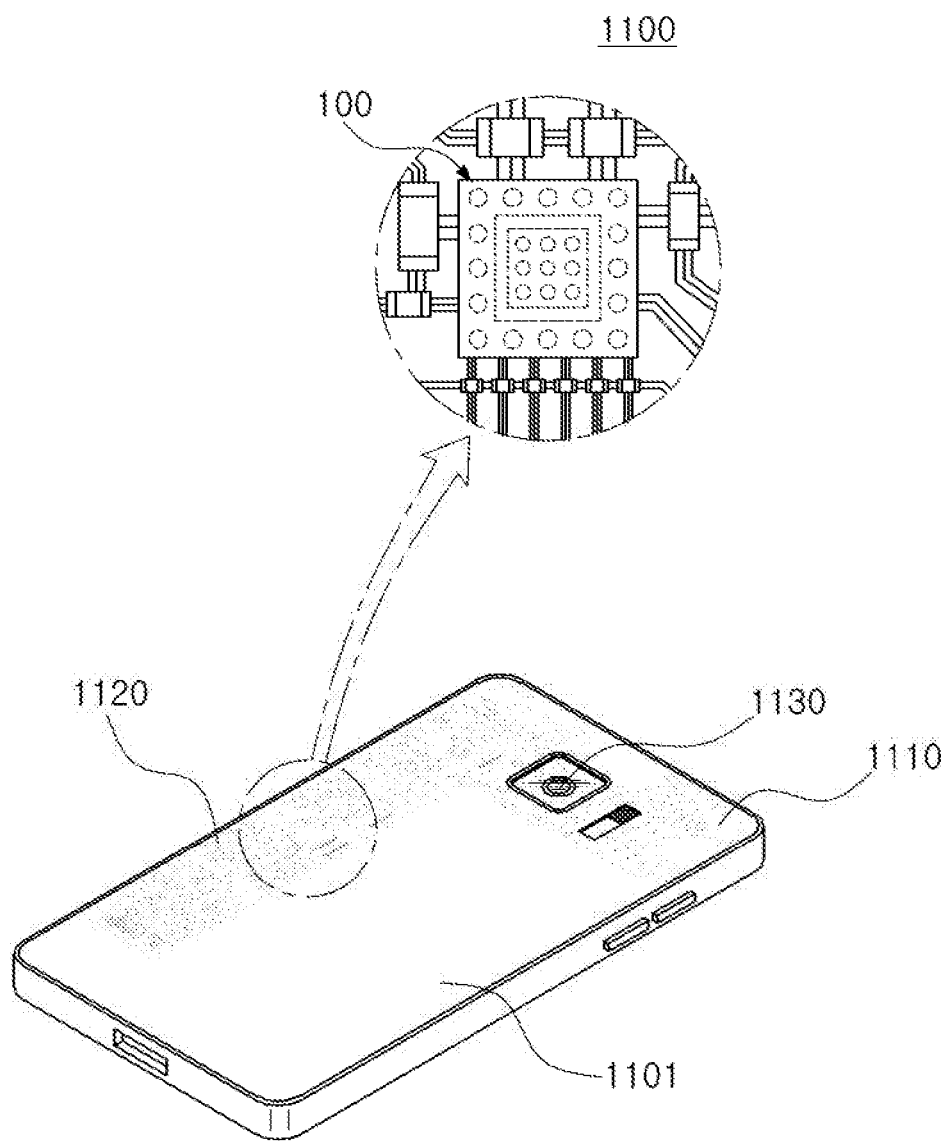
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
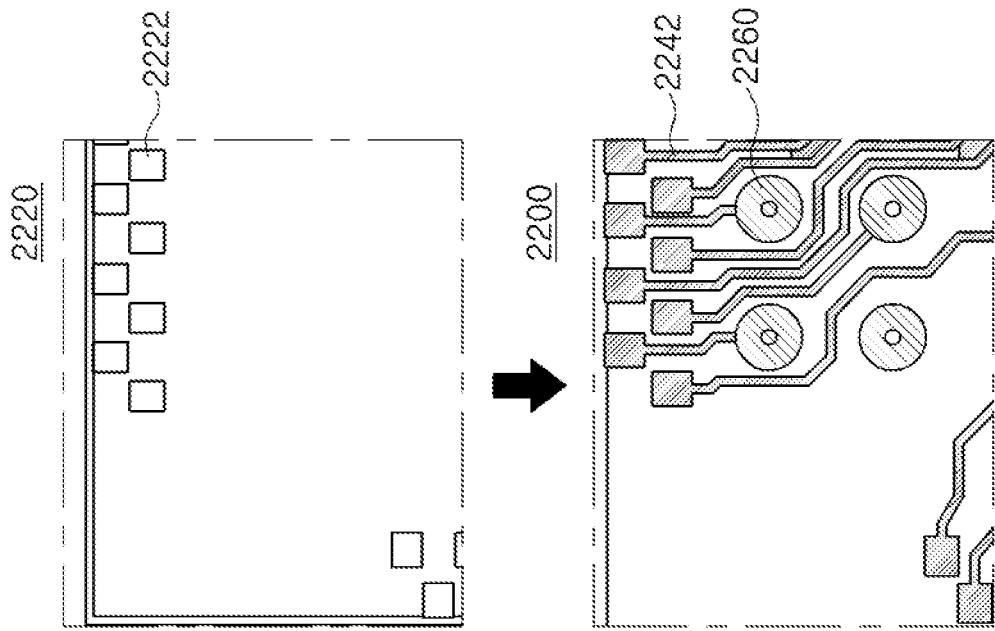
FIGS. 3A and 3B are schematic cross-sectional views illustrating states of a fan-in semiconductor package before and after being packaged.
Figure 3A:
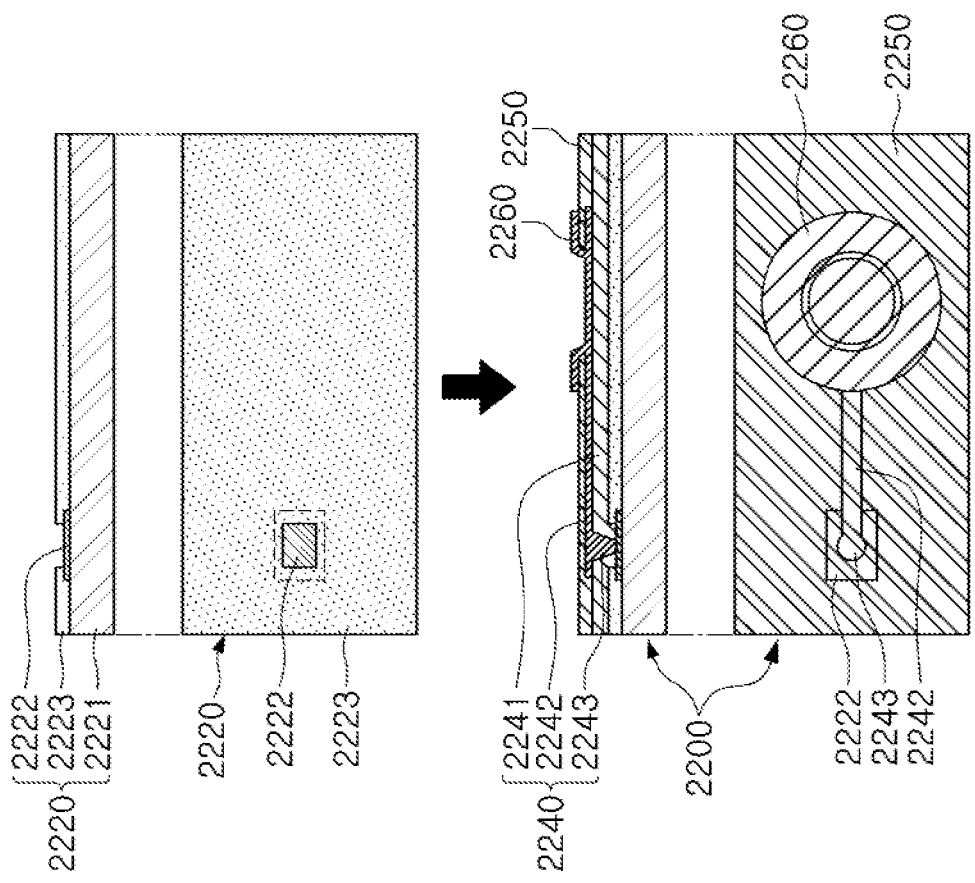

FIGS. 3A and 3B are schematic cross-sectional views illustrating states of a fan-in semiconductor package before and after being packaged.

Figure 4:
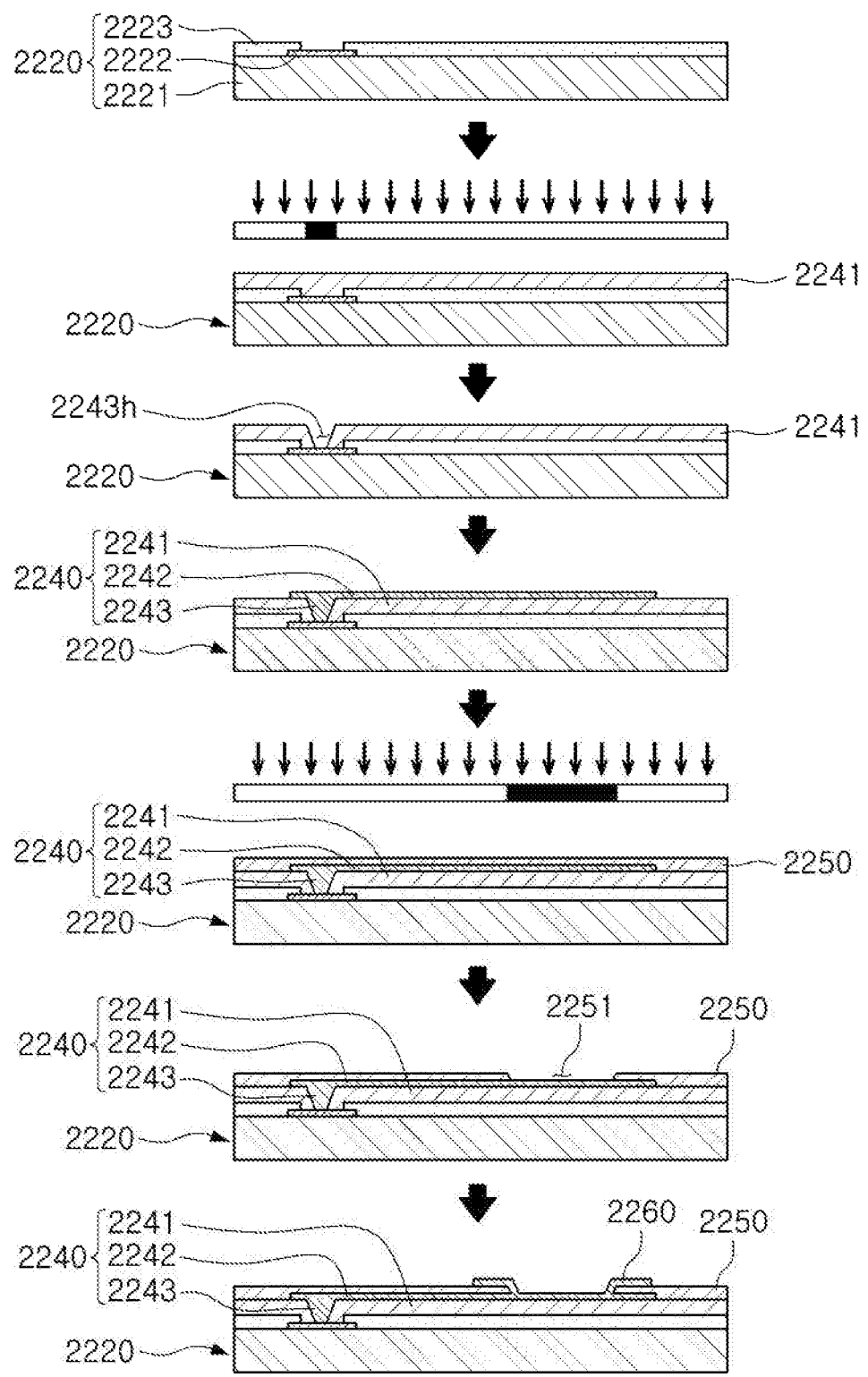
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
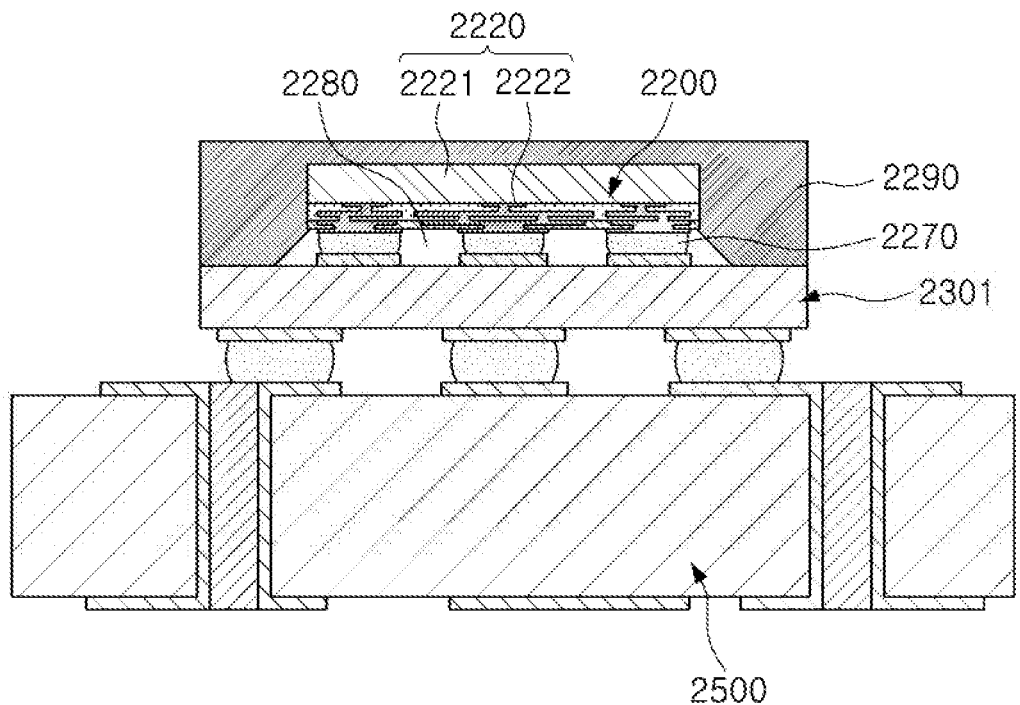
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
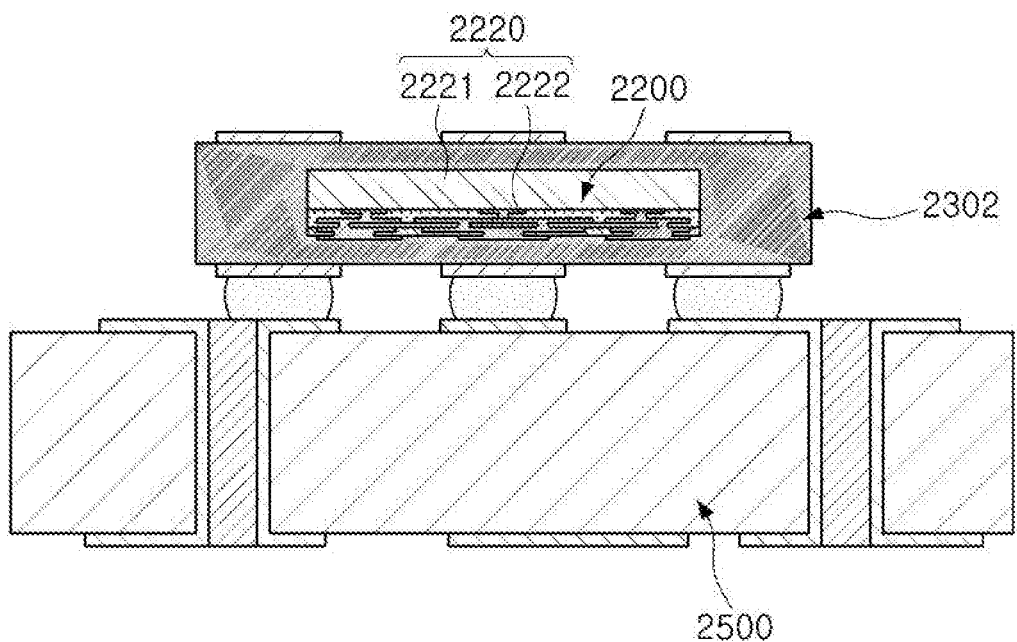
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
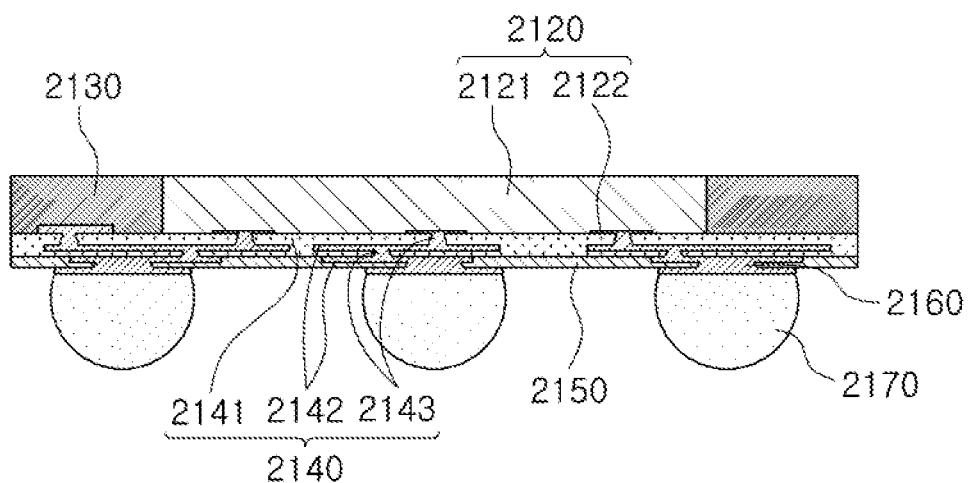
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like.

The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
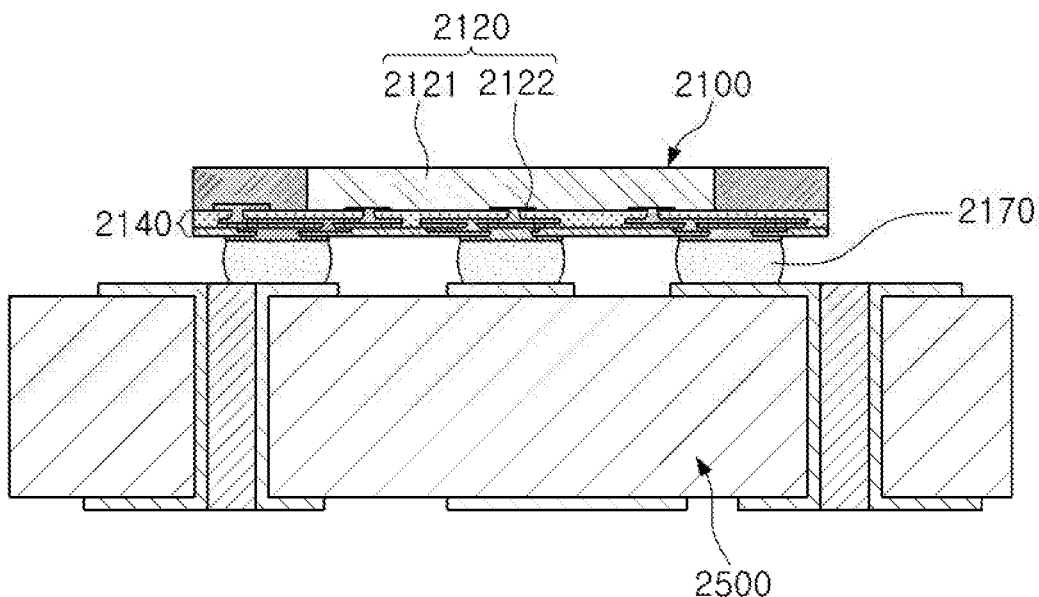
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a fan-out semiconductor package having an excellent heat dissipation characteristic and including a heat dissipation member which is effective in controlling a coefficient of thermal expansion will be described with reference to the drawings.

Figure 9:
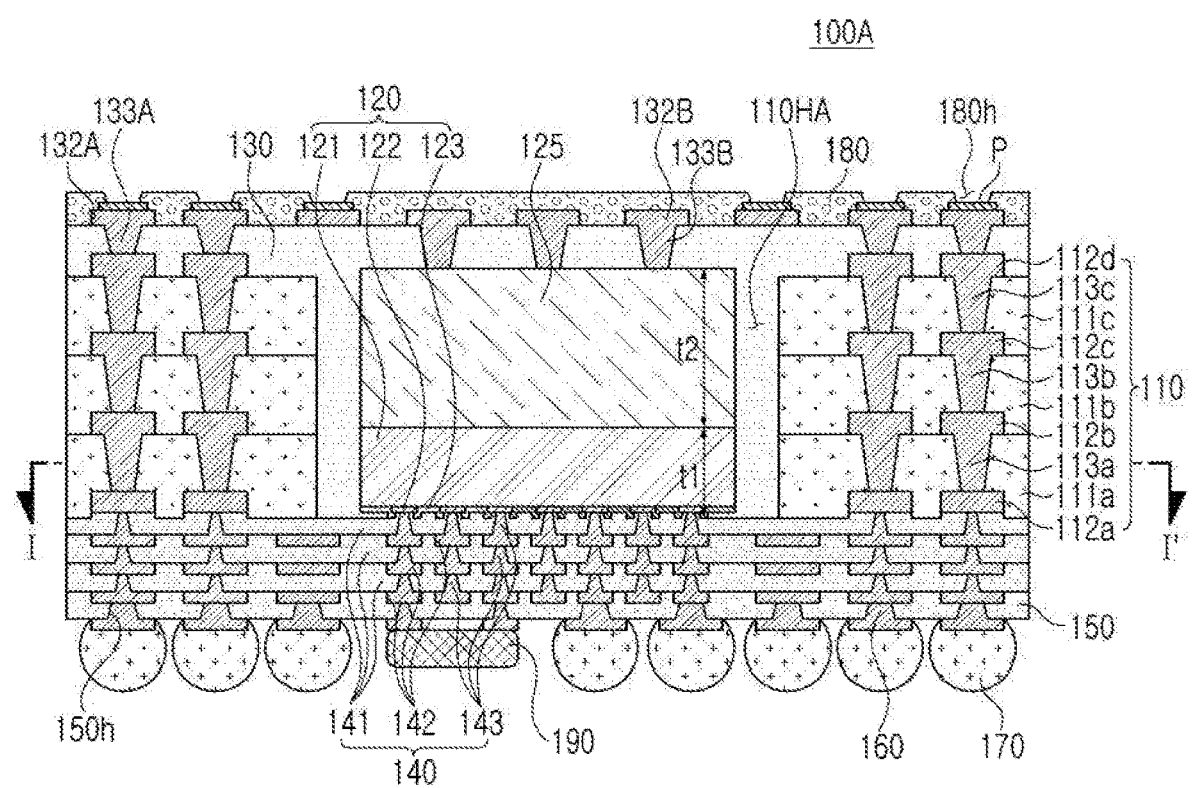
FIG. 9 is a schematic cross-sectional view illustrating an example of a fan-out semiconductor package.
Figure 10:
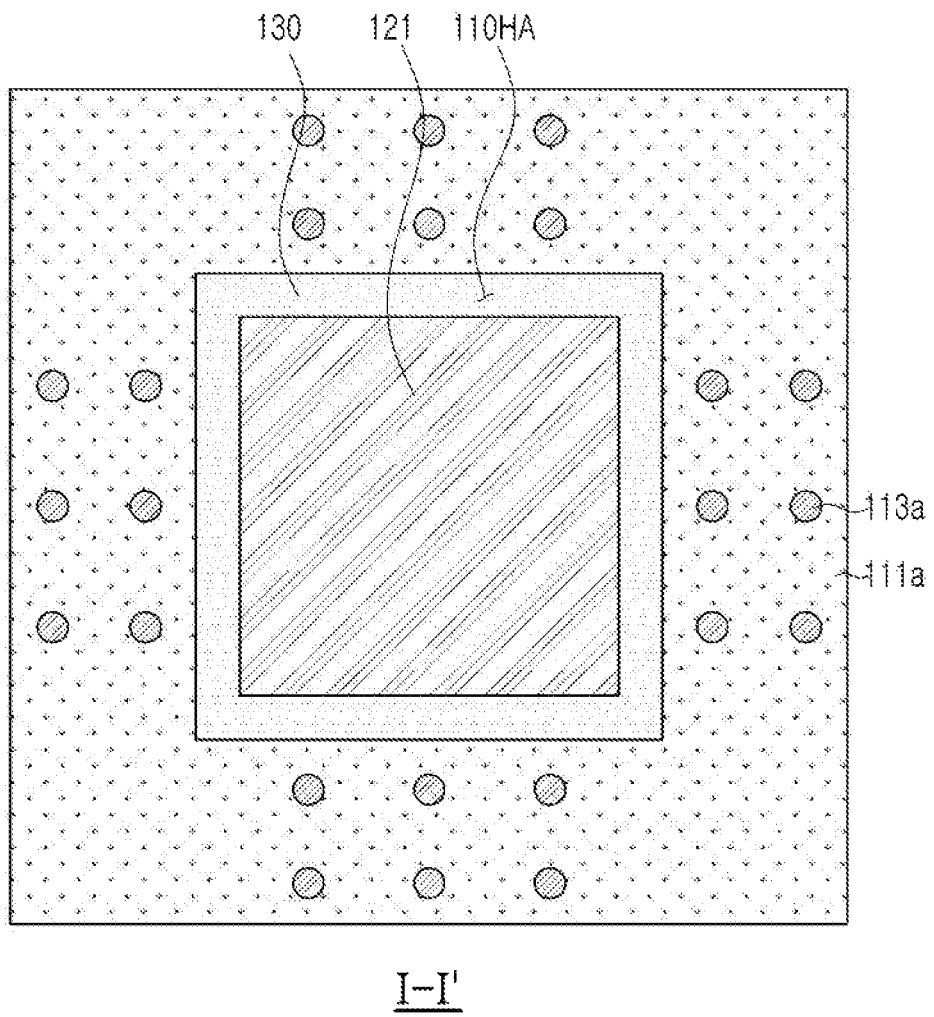
FIG. 10 is a schematic plan view taken along line I-I' of the fan-out semiconductor package of FIG. 9.
Figure 11:
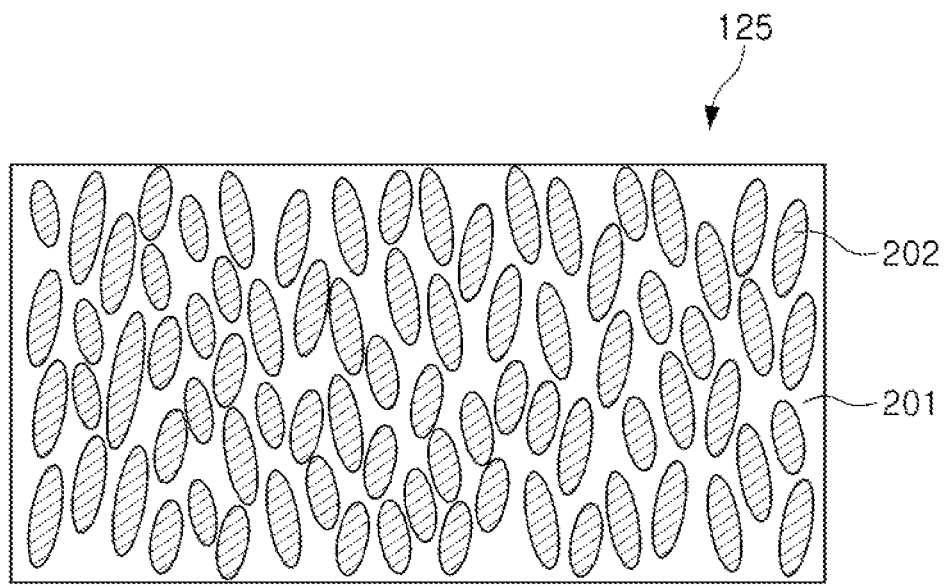
FIG. 11 is a schematic cross-sectional view illustrating a form of a heat dissipation member that may be adopted in an exemplary embodiment of FIG. 9.
Figure 12:
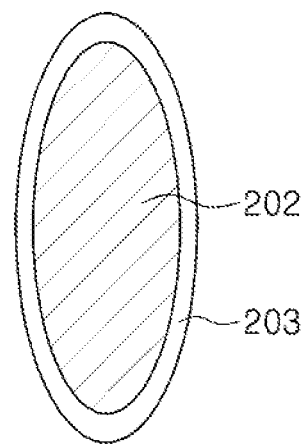
FIG. 12 is a cross-sectional view illustrating an example of a carbon particle that may be included in a heat dissipation member adopted in an exemplary embodiment of FIG. 9.

FIG. 9 is a schematic cross-sectional view illustrating an example of a fan-out semiconductor package. FIG. 10 is a schematic plan view taken along line I-I' of the fan-out semiconductor package of FIG. 9. FIG. 11 is a schematic cross-sectional view illustrating a form of a heat dissipation member that may be adopted in an exemplary embodiment of FIG. 9, and FIG. 12 is a cross-sectional view illustrating an example of a carbon particle that may be included in a heat dissipation member adopted in an exemplary embodiment of FIG. 9.

Referring to FIG. 9, a fan-out semiconductor package 100A according to an exemplary embodiment in the present disclosure includes a semiconductor chip 120 having an active surface on which connection pads 122 are disposed and an inactive surface opposing the active surface, a heat dissipation member 125 attached to the inactive surface of the semiconductor chip 120, an encapsulant 130 encapsulating at least portions of each of the semiconductor chip 120 and the heat dissipation member 125, and a connection member 140 disposed on the active surface of the semiconductor chip 120 and including redistribution layers 142 electrically connected to the connection pads 122. In the fan-out semiconductor package 100A according to the exemplary embodiment, the heat dissipation member 125 is attached to the inactive surface of the semiconductor chip 120, such that heat of the semiconductor chip 120 may be effectively dissipated.

According to the exemplary embodiment, the heat dissipation member 125 may be implemented by a complex of carbon and a metal. Since such a heat dissipation member 125 has high thermal conductivity and a coefficient of thermal expansion similar to that of the semiconductor chip 120 formed of silicon, or the like, a heat dissipation characteristic is excellent and at the same time, high mechanical stability may be secured. An example of a carbon component included in the heat dissipation member 125 may include diamond, diamond-like carbon, graphite, graphene, and the like, and a content of the carbon component may be about 20 wt % to 80 wt % with respect to the heat dissipation member 125. An example of a metal component included in the heat dissipation member 125 may include copper (Cu), aluminum (Al), silver (Ag), and the like, and a content of the metal component may be about 20 wt % to 80 wt % with respect to the heat dissipation member 125. Further, in order to significantly reduce a thermal contact resistance between a metal and carbon, the heat dissipation member 125 may include an additive at a content of less than about 5 wt %, and the additive may include zirconium (Zr), chromium (Cr), boron (B), and the like.

As illustrated in FIG. 11, the heat dissipation member 125 may have a form in which carbon particles 202 are dispersed in a metal matrix 201. In this case, the carbon particles 202 may have shape-anisotropy, and may have a form in which a major axis of each of the carbon particles 202 is oriented substantially in a thickness direction (longitudinal direction in FIG. 11) of the semiconductor chip 120 (for example, a direction perpendicular to the active surface or the inactive surface). A major axis of a carbon particle may refer to a line segment intersected by an edge of the carbon particle, and a length of such a line segment may be longer than a length of any other line segment intersected by the edge of the carbon particle. Heat dissipation efficiency in a vertical direction (e.g., the thickness direction of the semiconductor chip 120) may be improved by orienting the shape-anisotropic carbon particle 202 in the vertical direction. Here, the orientation in the vertical direction means that the carbon particles 202 are generally disposed in a nearly vertical direction and/or the entire carbon particles 202 are disposed in the vertical direction. For example, a majority of carbon particles 202, for example, 90% of carbon particles 202, may be disposed in the vertical direction or in the nearly vertical direction. Here, a carbon particle being disposed the vertical direction may mean that a major axis of the carbon particle is along the vertical direction, and a carbon particle being disposed in the nearly vertical direction may mean that an angle between a major axis of the carbon particle and the vertical direction is an acute angle, for example, 15 degree or less. An average of angles between the major axes of the carbon particles and the vertical direction may be less than a predetermined angle, for example, 10 degree.

Methods such as a powder metallurgical process, a spark plasma sintering method, an infiltration method, and the like may be used to implement such a carbon-metal complex forming the heat dissipation member 125. Further, in order to improve wettability of a metal and carbon, a metal layer 203 may be coated on a surface of each of the carbon particles 202 as illustrated in FIG. 12, and the metal layer 203 may be formed by, for example, an electroplating technology.

As illustrated in FIG. 9, the heat dissipation member 125 may be directly bonded to the inactive surface of the semiconductor chip 120, and the heat dissipation efficiency may be improved by such a direct bonding structure. In order for the heat dissipation member 125 and the semiconductor chip 120 to be directly bonded to each other, a surface of at least one of the heat dissipation member 125 and the semiconductor chip 120 may be mechanically or chemically modified. Specifically, the heat dissipation member 125 and the semiconductor chip 120 may be directly bonded to each other by pressing and heating the heat dissipation member 125 and the semiconductor chip 120, and a bonding layer that is distinguishable by using a transmission electron microscope may be formed between the heat dissipation member 125 and the semiconductor chip 120. However, a thickness of the bonding layer does not exceed several tens of nm. In addition, when directly bonding the heat dissipation member 125 and the semiconductor chip 120 to each other, a bonding surface may be polished to have a surface roughness Ra of 10 nm or less by using chemical mechanical polishing (CMP) or the like so that atoms constituting the heat dissipation member 125 and the semiconductor chip 120 may come in contact with each other. Further, there is a need to increase surface energy by removing a contamination, breaking an existing bond of the surface, introducing a new reactive functional group, and the like to allow a new bond to be formed at an interface between the heat dissipation member 125 and the semiconductor chip 120 when the heat dissipation member 125 and the semiconductor chip 120 come in contact with each other. To this end, both of the surface of the heat dissipation member 125 and the inactive surface of the semiconductor chip 120 may be subjected to plasma etching treatment or ion etching treatment. In this case, one or more of a molecular gas including hydrogen (H), carbon (C), fluorine (F), oxygen (O), nitrogen (N), sulfur (S), and phosphorus (P) and an inactive monatomic gas such as argon (Ar), xenon (Xe), krypton (Kr), and the like may be used for the plasma etching treatment and the ion etching treatment.

As illustrated, the heat dissipation member 125 may have a form in which a thickness t2 of the heat dissipation member 125 is greater than a thickness t1 of the semiconductor chip 120, and in this case, the heat dissipation effect may be significant. Further, such as form may significantly reduce a difference between heights of the heat dissipation member 125 and a core member 110 to be described below at the time of encapsulating the heat dissipation member 125 with the encapsulant 130, thereby significantly reducing defects caused by non-uniformity in encapsulation thickness. Specifically, when the heat dissipation member 125 is attached in a state in which the semiconductor chip 120 is not ground, an entire thickness of the semiconductor chip 120 and the heat dissipation member 125 after the heat dissipation member 125 is attached to the semiconductor chip 120 may become greater than that of the core member 110, such that a problem such as non-uniformity in encapsulation thickness may occur. When the thickness t2 of the heat dissipation member 125 is decreased in order to solve such a problem, the heat dissipation effect may not be sufficient. Therefore, it is preferable that the thickness t1 of the semiconductor chip 120 is smaller than the thickness t2 of the heat dissipation member 125. In this respect, the thickness t1 of the semiconductor chip 120 may be smaller than the thickness t2 of the heat dissipation member 125, and may be equal to or greater than 0.4 times the thickness t2 of the heat dissipation member 125.

Meanwhile, the encapsulant 130 may be formed of a material including an insulating resin and an inorganic filler, and in this case, a content of inorganic filler may be higher than that of inorganic filler in a general molding material or an encapsulation material to increase thermal conductivity. For example, the content of inorganic filler in the encapsulant 130 may be about 60 wt % to 80 wt %, but is not limited thereto.

Meanwhile, the fan-out semiconductor package 100A according to the exemplary embodiment may further include the core member 110 having a through-hole 110HA. In a case in which the core member 110 is introduced, a warpage may be more effectively controlled. Particularly, in a case in which a plurality of wiring layers 112a, 112b, 112c, and 112d formed of a metal material are formed in the core member 110, rigidity may be more effectively maintained.

Meanwhile, the fan-out semiconductor package 100A according to the exemplary embodiment may further include a heat dissipation pattern layer 132B disposed on the encapsulant 130, and heat dissipation vias 133B penetrating through at least portions of the encapsulant 130 and connecting the heat dissipation pattern layer 132B and the heat dissipation member 125 to each other. In a case in which the heat dissipation pattern layer 132B and the heat dissipation vias 133B are introduced, heat dissipated through the heat dissipation member 125 may be more effectively dissipated upwardly of the fan-out semiconductor package 100A.

Meanwhile, the fan-out semiconductor package 100A according to the exemplary embodiment may further include a backside wiring layer 132A disposed on the encapsulant 130, and backside vias 133A penetrating through at least portions of the encapsulant 130 and electrically connecting the backside wiring layer 132A and the uppermost wiring layer 112d of the plurality of wiring layers 112a, 112b, 112c, and 112d of the core member 110 to each other. In addition, the fan-out semiconductor package 100A according to the exemplary embodiment may further include a cover layer 180 disposed on the encapsulant 130 and having openings 180h exposing at least portions of the backside wiring layer 132A. In this case, a surface treatment layer P formed by plating metal such as noble metal may be disposed on a surface of the exposed backside wiring layer 132A. In addition, the fan-out semiconductor package 100A according to the exemplary embodiment may further include a passivation layer 150 disposed beneath the connection member 140 and having openings 150*h* exposing at least portions of the lowermost redistribution layer 142 of the redistribution layers 142 of the connection member 140, a plurality of underbump metals 160 formed in the openings 150*h* of the passivation layer 150 and connected to the exposed redistribution layer 142, and a plurality of electrical connection structures 170 disposed beneath the passivation layer 150 and connected to the plurality of underbump metals 160. Further, the fan-out semiconductor package 100A according to the exemplary embodiment may further include a surface mounting component 190 mounted on a lower surface of the passivation layer 150 through surface mounting technology (SMT).

The core member 110 may improve rigidity of the fan-out semiconductor package 100A depending on certain materials, and may serve to secure uniformity in thickness of the encapsulant 130. In a case in which the wiring layers 112*a*, 112*b*, 112*c*, and 112*d* and connection via layers 113*a*, 113*b*, and 113*c* are formed in the core member 110, the fan-out semiconductor package 110A may be utilized as a package on package (POP) type package. The core member 110 may have the through-hole 110HA. In the through-hole 110HA, the semiconductor chip 120 to which the heat dissipation member 125 is directly attached may be disposed to be spaced apart from the core member 110 by a predetermined distance. Side surfaces of the semiconductor chip 120 and the heat dissipation member 125 may be surrounded by the core member 110. However, such a form is only an example and may be variously modified to have other forms, and other functions may be performed in accordance with the other forms.

The core member 110 may include a first insulating layer 111*a* in contact with the connection member 140, a first wiring layer 112*a* in contact with the connection member 140 and embedded in the first insulating layer 111*a*, a second wiring layer 112*b* disposed on the other surface of the first insulating layer 111*a* opposing one surface of the first insulating layer 111*a* in which the first wiring layer 112*a* is embedded, a second insulating layer 111*b* disposed on the first insulating layer 111*a* and covering the second wiring layer 112*b*, a third wiring layer 112*c* disposed on the second insulating layer 111*b*, a third insulating layer 111*c* disposed on the second insulating layer 111*b* and covering the third wiring layer 112*c*, and a fourth wiring layer 112*d* disposed on the third insulating layer 111*c*. The first to fourth wiring layers 112*a*, 112*b*, 112*c*, and 112*d* may be electrically connected to the connection pads 122. The first to fourth wiring layers 112*a*, 112*b*, 112*c*, and 112*d* may be electrically connected to each other through the first to third connection via layers 113*a*, 113*b*, and 113*c*.

In a case in which the first wiring layer 112*a* is embedded in the first insulating layer 111*a*, a step generated due to a thickness of the first wiring layer 112*a* may be significantly reduced, such that an insulating distance of the connection member 140 may be uniform. A lower surface of the first wiring layer 112*a* of the core member 110 may be disposed on a level above a lower surface of the connection pads 122 of the semiconductor chip 120. That is, the first wiring layer 112*a* may be recessed into the first insulating layer 111*a*, such that a lower surface of the first insulating layer 111*a* and the lower surface of the first wiring layer 112*a* may have a step therebetween. In this case, a phenomenon in which a material of the encapsulate 130 bleeds to pollute the first wiring layer 112*a* may be prevented. The second and third wiring layers 112*b* and 112*c* may be disposed on a level between the active surface and the inactive surface of the semiconductor chip 120. The core member 110 may be manufactured at a sufficient thickness by a substrate process, or the like, while the connection member 140 may be manufactured at a small thickness by a semiconductor process, or the like. Therefore, a thickness of each of the wiring layers 112*a*, 112*b*, 112*c*, and 112*d* of the core member 110 may be greater than that of each of the redistribution layers 142 of the connection member 140.

A material of each of the insulating layers 111*a*, 111*b*, and 111*c* is not particularly limited. For example, an insulating material may be used as the material of each of the insulating layers 111*a*, 111*b*, and 111*c*. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. A photoimagable dielectric (PID) resin may also be used, if necessary.

The wiring layers 112*a*, 112*b*, 112*c*, and 112*d* may serve to redistribute the connection pads 122 of the semiconductor chip 120. A material of each of the wiring layers 112*a*, 112*b*, 112*c*, and 112*d* may be a conductive material such as copper (Cu), aluminum (Al), silver (Ag), tin (Sn), gold (Au), nickel (Ni), lead (Pb), titanium (Ti), or alloys thereof. The wiring layers 112*a*, 112*b*, 112*c*, and 112*d* may perform various functions depending on designs of corresponding layers. For example, the wiring layers 112*a*, 112*b*, 112*c*, and 112*d* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112*a*, 112*b*, 112*c*, and 112*d* may include via pads, wire pads, electrical connection structure pads, and the like.

The connection via layers 113*a*, 113*b*, and 113*c* may electrically connect the wiring layers 112*a*, 112*b*, 112*c*, and 112*d* formed on different layers to each other, resulting in an electrical path in the core member 110. A material of each of the connection via layers 113*a*, 113*b*, and 113*c* may be a conductive material. Each of the connection via layers 113*a*, 113*b*, and 113*c* may be completely filled with the conductive material, or the conductive material may be formed along a wall of each of via holes. Meanwhile, all the connection via layers 113*a*, 113*b*, and 113*c* may have tapered shapes of which directions are the same as each other, that is, tapered shapes of which upper diameters are greater than lower diameters, for a reason in a process.

The semiconductor chip 120 may be an integrated circuit (IC) in which several hundreds to several millions of elements or more are integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like. However, the IC is not limited thereto, but may also be another kind of IC such as a memory or a power management element.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 exposing the connection pads 122 may be formed on an active surface of the body 121, and may be an oxide layer, a nitride layer, or the like, or a double layer of an oxide layer and a nitride layer. A lower surface of the connection pad 122 may have a step with respect to a lower surface of the encapsulant 130 through the passivation layer 123. Therefore, the encapsulant 130 may fill at least a portion of a space between the passivation layer 123 and the connection member 140. In this case, a phenomenon in which the encapsulant 130 bleeds into the lower surface of the connection pad 122 may be prevented to some degree. An insulating layer (not illustrated), and the like, may also be further disposed in other required positions. The semiconductor chip 120 may be a bare die. Therefore, the connection pads 122 may be in physical contact with connection vias 143 of the connection member 140. However, depending on a kind of semiconductor chip 120, a separate redistribution layer (not illustrated) may further be formed on the active surface of the semiconductor chip 120, and bumps (not illustrated), or the like, may be connected to the connection pads 122.

As described above, the thickness t2 of the heat dissipation member 125 may be greater than the thickness t1 of the semiconductor chip 120. In this case, a heat dissipation effect may be significant, and a difference between heights of the heat dissipation member 125 and the core member 110 may be significantly decreased at the time of encapsulating the heat dissipation member 125 with the encapsulant 130, thereby significantly reducing defects caused by non-uniformity in encapsulation thickness. In detail, when the heat dissipation member 125 is attached to the semiconductor chip 120 in a state in which the semiconductor chip 120 is not ground, an entire thickness of the semiconductor chip 120 and the heat dissipation member 125 after the heat dissipation member 125 is attached to the semiconductor chip 120 may become greater than that of the core member 110, such that a problem such as the non-uniformity in encapsulation thickness may occur. When the thickness t2 of the heat dissipation member 125 is decreased in order to solve such a problem, a heat dissipation effect may not be sufficient.

The encapsulant 130 may protect the core member 110, the semiconductor chip 120, the heat dissipation member 125, and the like. An encapsulation form of the encapsulant 130 is not particularly limited, but may be a form in which the encapsulant 130 surrounds at least portions of the core member 110, the semiconductor chip 120, the heat dissipation member 125, and the like. For example, the encapsulant 130 may cover upper portions of the core member 110 and the heat dissipation member 125, and fill at least a portion of the through-hole 110HA to cover side portions of the semiconductor chip 120. Meanwhile, the encapsulant 130 may fill the through-hole 110HA to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. A photoimagable encapsulant (PIE) resin may also be used, if necessary.

When the encapsulant 130 is formed of a material including an insulating resin and an inorganic filler, a content of inorganic filler in the encapsulant 130 may be higher than that of inorganic filter in a general molding material or encapsulant in order to increase thermal conductivity. For example, the content of inorganic filler in the encapsulant 130 may be 60 wt % to 80 wt %, but is not limited thereto.

A material of each of the backside wiring layer 132A and the backside vias 133A may be a conductive material such as copper (Cu), aluminum (Al), silver (Ag), tin (Sn), gold (Au), nickel (Ni), lead (Pb), titanium (Ti), or alloys thereof. A material of each of the heat dissipation pattern layer 132B and the heat dissipation vias 133B may also be the conductive material described above. The backside wiring layer 132A may perform various functions depending on a design. For example, the backside wiring layer 132A may include ground (GND) patterns, power (PWR) patterns, signal (S) patterns, and the like. Each of the backside vias 133A and the heat dissipation vias 133B may have a tapered shape of which a tapered direction is the same as that of each of the connection via layers 113$a$, 113$b$, and 113$c$ of the core member 110.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on functions. The connection member 140 may include insulating layers 141 disposed on the core member 110 and the active surface of the semiconductor chip 120, the redistribution layers 142 disposed on the insulating layers 141, and the connection vias 143 penetrating through the insulating layers 141 and connecting the connection pads 122 and the redistribution layers 142 to each other. A case in which the connection member 140 includes a plurality of insulating layers, a plurality of redistribution layers, and a plurality of via layers is illustrated in the drawings, but the connection member 140 may include smaller numbers or larger numbers of insulating layers, redistribution layers, and via layers than those illustrated in the drawings depending on a design.

A material of each of the insulating layers 141 may be an insulating material. In this case, a photosensitive insulating material such as a PID resin may also be used as the insulating material in addition to the insulating materials described above. That is, each of the insulating layers 141 may be a photosensitive insulating layer. When the insulating layer 141 has photosensitive properties, the insulating layer 141 may be formed to have a smaller thickness, and a fine pitch of a connection via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent. However, the insulation layers 141 are not limited thereto.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns.

The connection vias 143 may electrically connect the redistribution layers 142, the connection pads 122, and the like, formed on different layers to each other, resulting in an electrical path in the fan-out semiconductor package 100A. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be completely filled with the conductive material, or the conductive material may be formed along a wall of each of via holes. Meanwhile, each of the connection vias 143 of the connection member 140 may have a tapered shape of which a direction is opposite to that of each of the connection via layers 113a, 113b, and 113c of the core member 110. That is, an upper diameter of each of the connection vias 143 may be smaller than a lower diameter of each of the connection vias 143.

The passivation layer 150 may protect the connection member 140 from external physical or chemical damage. The passivation layer 150 may have the openings 150h exposing at least portions of the lowermost redistribution layer 142 of the connection member 140. The number of openings 150h formed in the passivation layer 150 may be several tens to several thousands. The surface treatment layer (not illustrated) may be formed by plating such as noble metal plating on a surface of the exposed redistribution layer 142. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The underbump metals 160 may improve connection reliability of the electrical connection structures 170 to improve board level reliability of the fan-out semiconductor package 100A. The underbump metals 160 may be connected to the redistribution layer 142 of the connection member 140 exposed through the openings 150h of the passivation layer 150. The underbump metals 160 may be formed in the openings 150h of the passivation layer 150 by any known metallization method using any known conductive material such as a metal, but are not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a low melting point metal, for example, a solder such as tin (Sn)-aluminum (Al)-copper (Cu), or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metals 160 extending onto one surface of the passivation layer 150, and connection reliability may be more excellent. At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The cover layer 180 may protect the backside wiring layer 132A or the heat dissipation pattern layer 132B from external physical or chemical damage. The cover layer 180 may have the openings 180h exposing at least portions of the backside wiring layer 132A. The number of openings 180h formed in the cover layer 180 may be several tens to several thousands. The surface treatment layer P may be formed on the surface of the exposed backside wiring layer 132A. A material of the cover layer 180 is not particularly limited. For example, an insulating material may be used as the material of the cover layer 180. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The surface mounting component 190 may be mounted on a lower surface of the passivation layer 150 through surface mounting technology (SMT). The surface mounting component 190 may be any known passive component such as a capacitor, an inductor, or the like, but is not limited thereto. The surface mounting component 190 may be an active component, if necessary. The surface mounting component 190 may be electrically connected to the connection pads 122 of the semiconductor chip 120 through the redistribution layers 142 of the connection member 140.

Meanwhile, although not illustrated, a plurality of semiconductor chips 120 performing functions that are the same as or different from each other may be disposed in the through-hole 110HA, if necessary. In addition, a separate passive component such as an inductor, a capacitor, or the like, may be disposed in the through-hole 110HA, if necessary.

FIGS. 13 through 16 are schematic cross-sectional views illustrating other examples of a fan-out semiconductor package.

Figure 13:
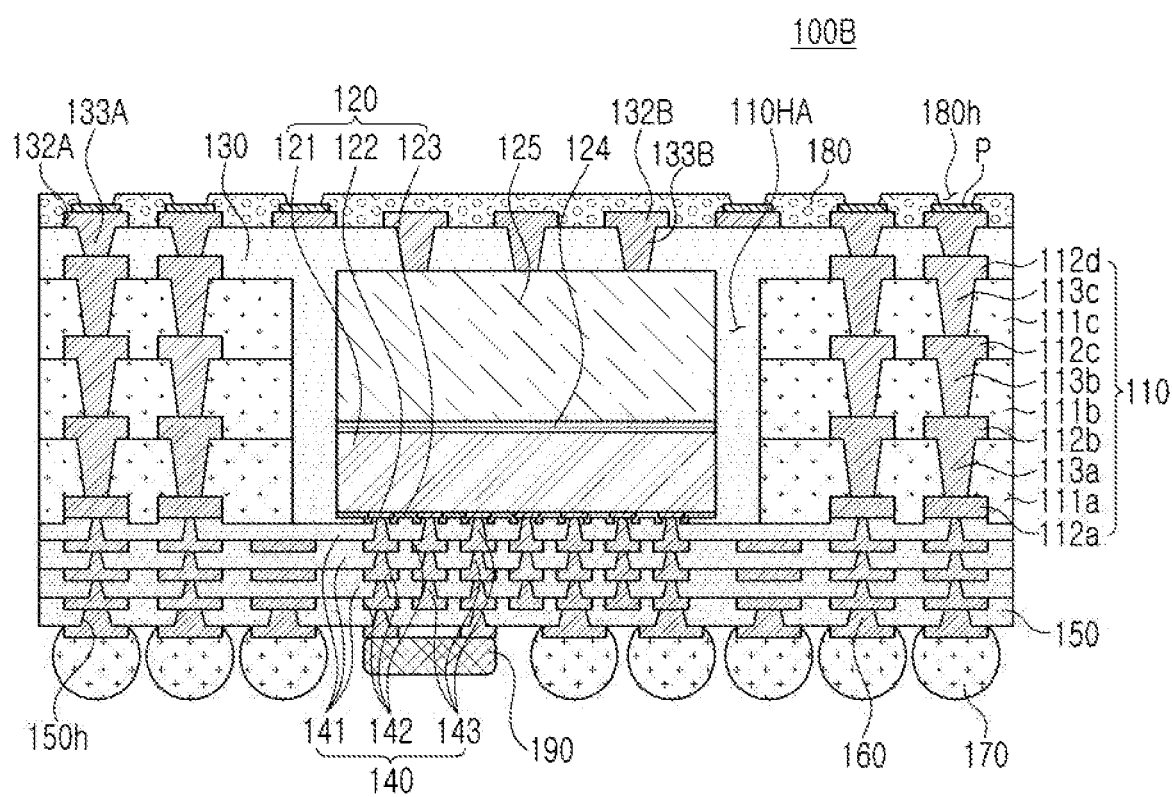
FIGS. 13 through 16 are schematic cross-sectional views illustrating other examples of a fan-out semiconductor package.

First, a fan-out semiconductor package 100B according to an exemplary embodiment of FIG. 13 may have a structure in which a heat dissipation member 125 is attached to an inactive surface of a semiconductor chip 120 through an adhesive layer 124. As the adhesive layer 124, for example, a thermosetting adhesive layer may be used, and it may be advantageous in improving heat dissipation performance that a thin adhesive having a thickness of about 1 μm or less is used. In addition, a commercially available die attach film (DAF) may be used as the adhesive layer 124. When a die attach film commercially available in the related art is used, a thickness of the adhesive layer 124 needs to be significantly decreased in order to improve a heat dissipation effect and may be, for example, 10 μm or less, that is, about 1 μm to 10 μm. The adhesive layer 124 may include a heat dissipation filler in order to further improve a heat dissipation effect. An encapsulant 130 may protect the core member 110, the semiconductor chip 120, the adhesive layer 124, the heat dissipation member 125, and the like. An encapsulation form of the encapsulant 130 is not particularly limited, but may be a form in which the encapsulant 130 surrounds at least portions of the core member 110, the semiconductor chip 120, the adhesive layer 124, the heat dissipation member 125, and the like. For example, the encapsulant 130 may cover upper portions of the core member 110 and the heat dissipation member 125, and fill at least a portion of the through-hole 110HA to cover side portions of the adhesive layer 124 and the semiconductor chip 120. Meanwhile, the encapsulant 130 may fill the through-hole 110HA to thus serve as an adhesive and reduce buckling of the semiconductor chip 120 depending on certain materials. Other contents overlap those described above with reference to FIGS. 9 to 12, and a detailed description thereof is thus omitted.

Figure 14:
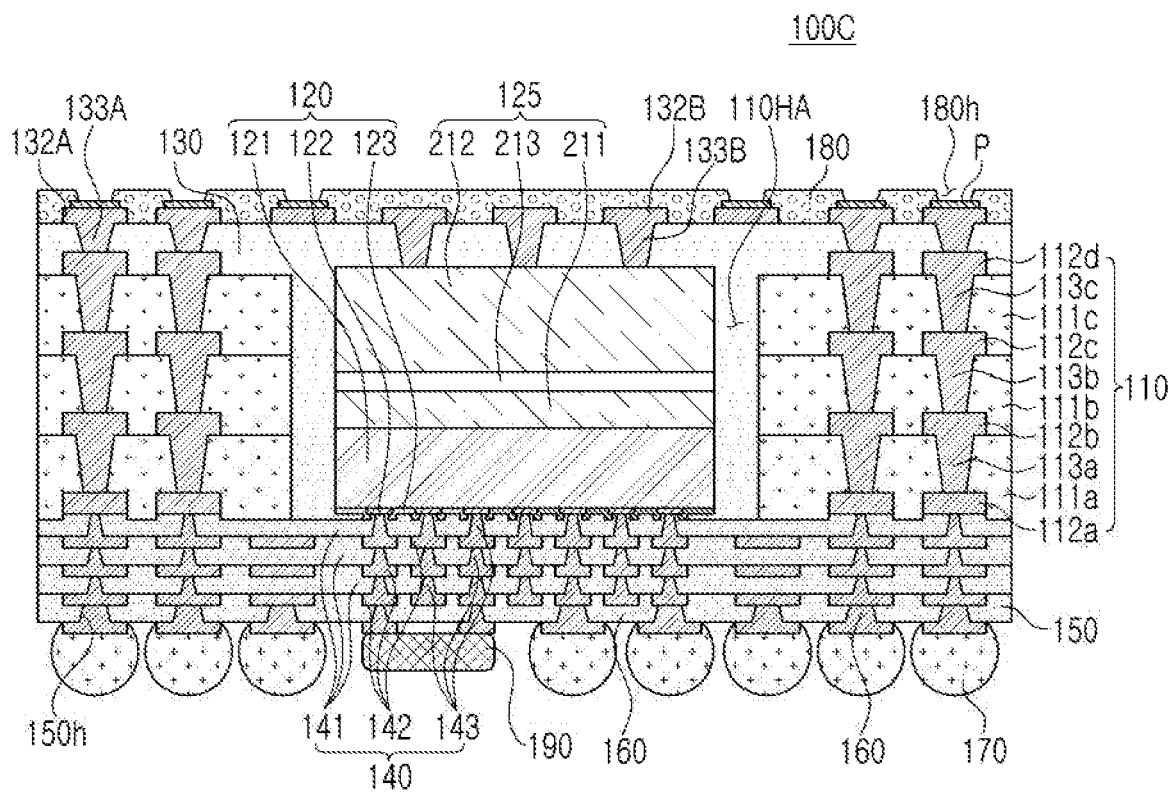

Next, in a fan-out semiconductor package 100C according to an exemplary embodiment of FIG. 14, a heat dissipation member 125 may have a structure in which a plurality of heat dissipation layers 211 and 212 are stacked. The heat dissipation member 125 includes two heat dissipation layers 211 and 212 in FIG. 14, however, the heat dissipation member 125 may include a larger number of heat dissipation layers 211 and 212. An adhesive layer 213 may be disposed between the plurality of heat dissipation layers 211 and 212. Heat dissipation directions of the plurality of heat dissipation layers 211 and 212 may be controlled, if necessary. In detail, orientations of carbon particles included in the plurality of heat dissipation layers 211 and 212 may be different from each other. For example, carbon particles included in the heat dissipation layer 211 close to a semiconductor chip 120 may be oriented in a horizontal direction (transverse direction in FIG. 14), and carbon particles included in the heat dissipation layer 212 disposed away from the semiconductor chip 120 may be oriented substantially in a vertical direction. Other contents overlap those described above with reference to FIGS. 9 to 13, and a detailed description thereof is thus omitted.

Figure 15:
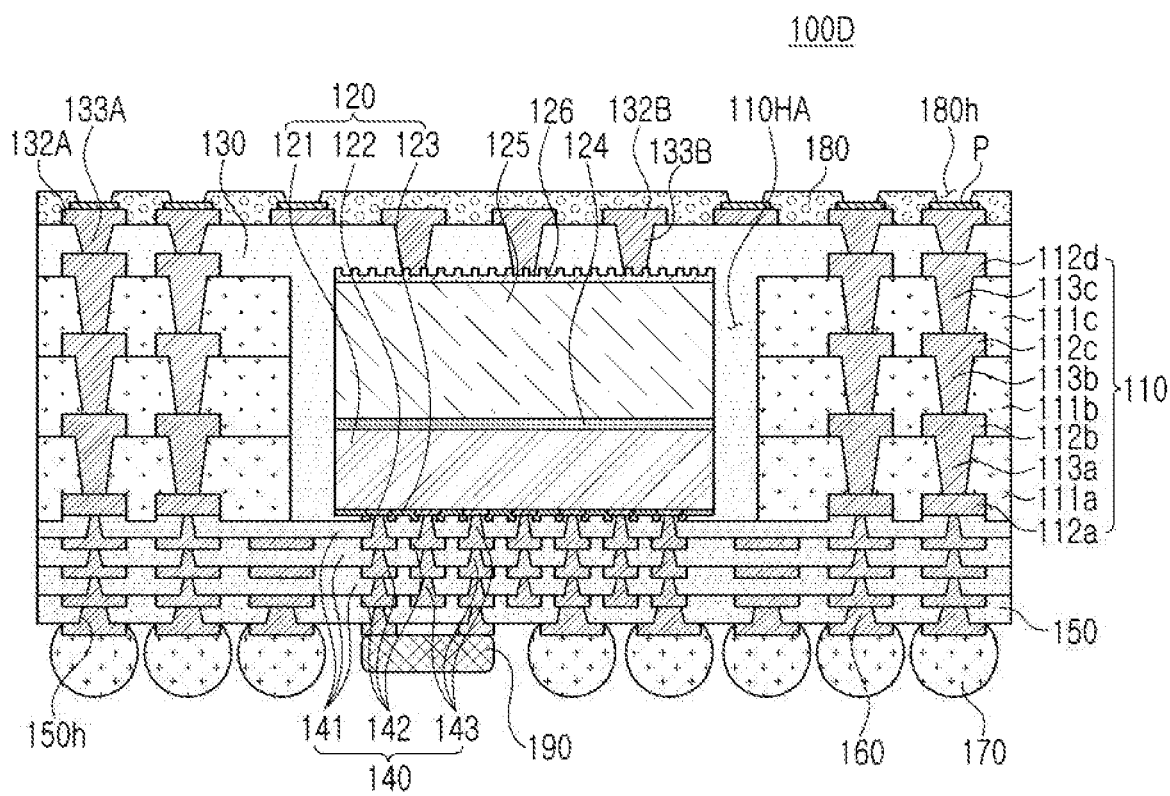

Next, a fan-out semiconductor package 100D according to an exemplary embodiment of FIG. 15 may include a metal pattern layer 126 as a structure for further improving heat dissipation efficiency. The metal pattern layer 126 may be disposed on the other surface of a heat dissipation member 125 opposing one surface of the heat dissipation member 125 on which a semiconductor chip 120 is disposed and have an unevenness surface structure. The metal pattern layer 126 may be formed of a metal having excellent heat dissipation performance such as copper (Cu), aluminum (Al), silver (Ag), or the like. Since thermal conductivity of the metal pattern layer 126 is lower than that of the heat dissipation member 125 which is a metal-carbon complex in many cases, the metal pattern layer 126 may be formed to have a small thickness and a large surface area, thereby improving heat dissipation efficiency. Such a metal pattern layer 126 may be obtained by performing, for example, methods such as electroplating on a surface of the heat dissipation member 125. Other contents overlap those described above with reference to FIGS. 9 to 14, and a detailed description thereof is thus omitted.

Figure 16:
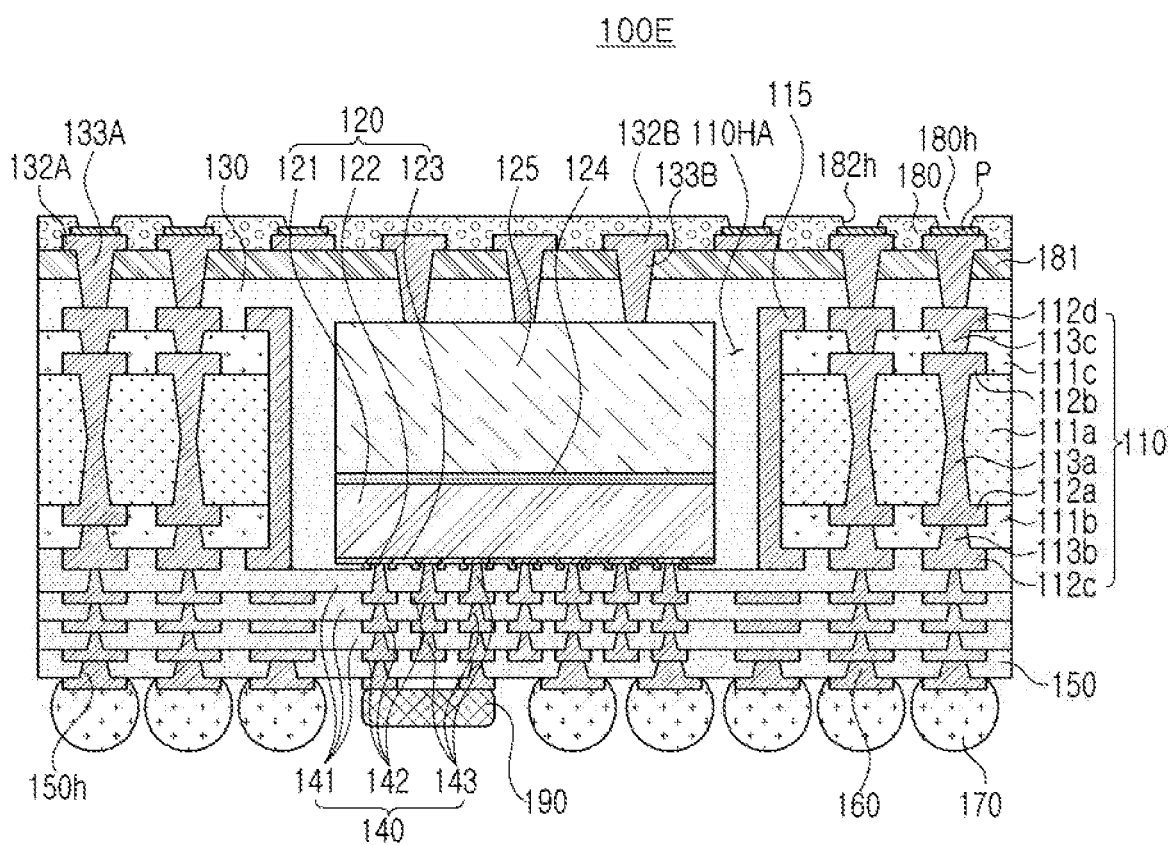

Next, a fan-out semiconductor package 100E according to an exemplary embodiment of FIG. 16 is different from those according to the exemplary embodiments described above in view of a core member, and the like. In detail, the fan-out semiconductor package 100E according to the exemplary embodiment may further include metal layers 115 formed on walls of a through-hole 110HA. The metal layers 115 may extend to an upper surface of a core member 110, and may be electrically connected to ground patterns of wiring layers 112a, 112b, 112c, and 112d of the core member 110 or ground patterns of redistribution layers 142 of a connection member 140. Heat generated from a semiconductor chip 120 may be effectively transferred to side portions of the fan-out semiconductor package 100E through the metal layers 115 to be dissipated externally. The metal layers 115 may be formed of the same conductive material as that of each of the wiring layers 112a, 112b, 112c, and 112d of the core member 110.

As illustrated in FIG. 16, the core member 110 may include a first insulating layer 111a, a first wiring layer 112a and a second wiring layer 112b disposed on upper and lower surfaces of the first insulating layer 111a, respectively, a second insulating layer 111b disposed on the lower surface of the first insulating layer 111a and covering the first wiring layer 112a, a third wiring layer 112c disposed on a lower surface of the second insulating layer 111b, a third insulating layer 111c disposed on the upper surface of the first insulating layer 111a and covering the second wiring layer 112b, and a fourth wiring layer 112d disposed on an upper surface of the third insulating layer 111c. The first to fourth wiring layers 112a, 112b, 112c, and 112d may be electrically connected to connection pads 122. Since the core member 110 may include a large number of wiring layers 112a, 112b, 112c, and 112d, a connection member 140 may be simplified. Therefore, a decrease in a yield caused by a defect occurring in a process of forming the connection member 140 may be suppressed. Meanwhile, the first to fourth wiring layers 112a, 112b, 112c, and 112d may be electrically connected to each other through first to third connection via layers 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first connection via layer 113a penetrating through the first insulating layer 111a may have a diameter greater than those of the second and third connection via layers 113b and 113c each penetrating through the second and third insulating layers 111b and 111c.

A lower surface of the third wiring layer 112c of the core member 110 may be disposed on a level below a lower surface of the connection pad 122 of a semiconductor chip 120. In addition, a distance between a redistribution layer 142 of the connection member 140 and the third wiring layer 112c of the core member 110 may be smaller than that between the redistribution layer 142 of the connection member 140 and the connection pad 122 of the semiconductor chip 120. The reason is that the third wiring layer 112c may be disposed on the second insulating layer 111b in a protruding form, resulting in being in contact with the connection member 140. The first wiring layer 112a and the second wiring layer 112b of the core member 110 may be disposed on a level between an active surface and an inactive surface of the semiconductor chip 120. A thickness of each of the wiring layers 112a, 112b, 112c, and 112d of the core member 110 may be greater than that of each of the redistribution layers 142 of the connection member 140. The first connection via layer 113a may have an hourglass shape, and the second and third connection via layers 113b and 113c may have tapered shapes of which directions are opposite to each other. Other contents overlap those described above with reference to FIGS. 9 to 15, and a detailed description thereof is thus omitted.

As set forth above, according to the exemplary embodiment in the present disclosure, the fan-out semiconductor package having an excellent heat dissipation characteristic and including the heat dissipation member having a thermal expansion property similar to that of the semiconductor chip may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package, comprising:
   a semiconductor chip having an active surface on which connection pads are disposed and an inactive surface opposing the active surface;
   a heat dissipation member attached to the inactive surface of the semiconductor chip and having a thickness greater than a thickness of the semiconductor chip;
   an encapsulant encapsulating at least a portion of each of the semiconductor chip and the heat dissipation member and covering at least a portion of an outermost side surface of the heat dissipation member;
   a connection member disposed on the active surface of the semiconductor chip and including redistribution layers electrically connected to the connection pads,
   a heat dissipation pattern layer disposed on the encapsulant;
   heat dissipation vias penetrating at least portions of the encapsulant and connecting the heat dissipation pattern layer and the heat dissipation member to each other; and
   a cover layer disposed on the encapsulant and covering at least a portion of an outermost side surface of the heat dissipation pattern layer,
   wherein the heat dissipation member is a complex of carbon and a metal.

2. The fan-out semiconductor package of claim 1, wherein the heat dissipation member has a form in which carbon particles are dispersed in a metal matrix.

3. The fan-out semiconductor package of claim 2, wherein the carbon particles have shape-anisotropy and have a form in which a major axis of each of the carbon particles is oriented substantially in a thickness direction of the semiconductor chip.

4. The fan-out semiconductor package of claim 2, wherein a metal layer is coated on a surface of each of the carbon particles.

5. The fan-out semiconductor package of claim 2, wherein the heat dissipation member has a structure in which a plurality of heat dissipation layers are stacked.

6. The fan-out semiconductor package of claim 5, wherein the carbon particles have shape-anisotropy and orientations of the carbon particles included in the plurality of heat dissipation layers are different from each other.

7. The fan-out semiconductor package of claim 1, wherein the heat dissipation member further includes an additive, and the additive includes at least one of zirconium (Zr), chromium (Cr), and boron (B).

8. The fan-out semiconductor package of claim 7, wherein a content of the additive in the heat dissipation member is less than about 5 wt % with respect to the heat dissipation member.

9. A fan-out semiconductor package, comprising:
   a semiconductor chip having an active surface on which connection pads are disposed and an inactive surface opposing the active surface;
   a heat dissipation member attached to the inactive surface of the semiconductor chip and having a thickness greater than a thickness of the semiconductor chip;
   an encapsulant encapsulating at least a portion of each of the semiconductor chip and the heat dissipation member; and
   a connection member disposed on the active surface of the semiconductor chip and including redistribution layers electrically connected to the connection pads,
   wherein the heat dissipation member is a complex of carbon and a metal,
   wherein the heat dissipation member is attached to the inactive surface of the semiconductor chip through an adhesive layer.

10. The fan-out semiconductor package of claim 9, wherein the adhesive layer includes a heat dissipation filler.

11. The fan-out semiconductor package of claim 9, wherein a thickness of the adhesive layer is 1μ or less.

12. The fan-out semiconductor package of claim 1, wherein the heat dissipation member is directly bonded to the inactive surface of the semiconductor chip.

13. The fan-out semiconductor package of claim 1, further comprising a metal pattern layer directly disposed on the other surface of the heat dissipation member opposing one surface of the heat dissipation member on which the semiconductor chip is disposed and having an unevenness surface structure.

14. The fan-out semiconductor package of claim 1, wherein the carbon included in the heat dissipation member includes one or more selected from a group consisting of diamond, diamond-like carbon, graphite, and graphene.

15. The fan-out semiconductor package of claim 1, wherein a content of the carbon in the heat dissipation member is about 20 wt % to 80 wt % with respect to the heat dissipation member.

16. The fan-out semiconductor package of claim 1, wherein the metal included in the heat dissipation member includes one or more selected from a group consisting of copper (Cu), aluminum (Al), and silver (Ag).

17. The fan-out semiconductor package of claim 1, wherein a content of the metal in the heat dissipation member is about 20 wt % to 80 wt % with respect to the heat dissipation member.

* * * * *